(12) United States Patent
Kao et al.

(10) Patent No.: US 6,768,333 B1
(45) Date of Patent: Jul. 27, 2004

(54) TEST CIRCUIT FOR INPUT-TO-OUTPUT SPEED MEASUREMENT

(75) Inventors: Oliver C. Kao, Cupertino, CA (US); Gladwyn O. D'Souza, Los Gatos, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/437,862

(22) Filed: May 13, 2003

(51) Int. Cl.[7] .............................................. G01R 31/26
(52) U.S. Cl. ..................... 324/765; 324/158.1; 324/161
(58) Field of Search ................................ 324/765, 763, 324/158.1, 758, 161, 162; 368/113, 118, 120, 2, 56, 57; 438/17, 18, 14; 714/720, 719, 724

(56) References Cited

U.S. PATENT DOCUMENTS 5,818,250 A * 10/1998 Yeung et al. ............... 324/763

6,219,305 B1 * 4/2001 Patrie et al. ................ 368/113

* cited by examiner

Primary Examiner—Evan Pert
Assistant Examiner—Jimmy Nguyen
(74) Attorney, Agent, or Firm—Thomas Schneck; Mark Protsik

(57) ABSTRACT

A test circuit aids in accurately measuring the input pin to output pin signal propagation speed through an integrated circuit by providing a D flip-flop in the signal path near the output pad to register the arrival of a test signal transition. The flip-flop is clocked at various clock frequencies. At the high frequencies, test signal transitions applied at the input pad coincident with a clock transition having not arrived at the output pad in time to be registered at the next clock transition. At lower clock frequencies, the test transition has time to propagate through the integrated circuit and thus will be registered by the flip-flop. By successively lowering the clock frequency and sending test signals through the circuit, one-half of that clock period that just registers the test signal transition corresponds to the input-to-output delay time being measured.

4 Claims, 2 Drawing Sheets ical field

TEST CIRCUIT FOR INPUT-TO-OUTPUT SPEED MEASUREMENT

TECHNICAL FIELD

The present invention relates to testing of integrated circuit (IC) die or completed packages, and in particular to the measurement of input pin to output pin signal propagation speed.

BACKGROUND ART

One important measure in the testing of IC die and completed IC packages is the speed from an input pin through the chip to an output pin. It is important for quality control and meeting customer's specifications that the test equipment accurately measure this value. FIG. 1 illustrates how this is usually done. A typical IC package 11 is laid out with pins or pads 15 surrounding the core circuitry 13. An internal speed path 17 through the core 13 connects an input pad 19 to an output pad 21, with a buffer element 20 in the circuit block 17 driving the output pad 21. Probes 23 and 25 of the test equipment contact the pads 19 and 21. The time it takes for a signal transition applied to the input pads 19 by the probe 23 to propagate to the output pad 21 and probe 25 is the speed data to be measured.

As IC technology migrates to lower signal voltages (5V, 3.3V, 2.5V, 1.8V, 1.5V, . . . ) and increases in speed, the input-to-output time becomes more difficult to measure accurately. When the time value goes below 3 ns, many testers cannot provide the required testing accuracy. Since the test probes need to contact the pads to make the measurement, the test set up itself adds load to the circuit being tested. The load that the testing equipment creates can slow down the data dramatically.

Thus, for example, an extra nanosecond is 20% for 5 ns part, but 33% for a 3 ns part. What is even worse, there can be considerable load variation between different test equipment units, producing uncertainty in the measurements.

An object of the present invention is to provide a test circuit integrated on the chip from which universal speed data that is accurate can be obtained.

DISCLOSURE OF THE INVENTION

The object is met by adding a D flip-flop to the speed path that registers the arrival at the output pad of a signal transition applied to the input pad. This flip-flop is clocked at variable clock-speed, so that at some higher clock frequencies, the transition has not yet arrived in time to be registered, while at lower clock frequencies, the transition is registered by the flip-flop. One-half the clock period that just registers the transition corresponds to the input-to-output delay time.

BEST MODE FOR CARRYING OUT THE INVENTION

Figure 1:
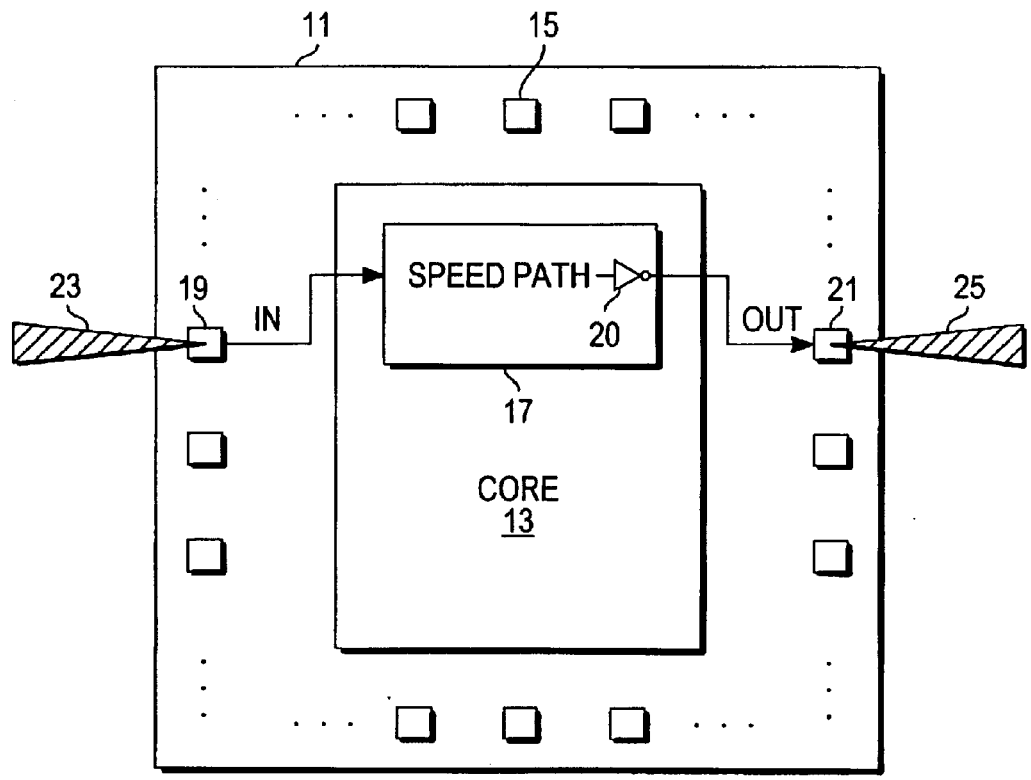
FIG. 1 is a schematic plan view of a chip package illustrating prior art speed testing.
Figure 2:
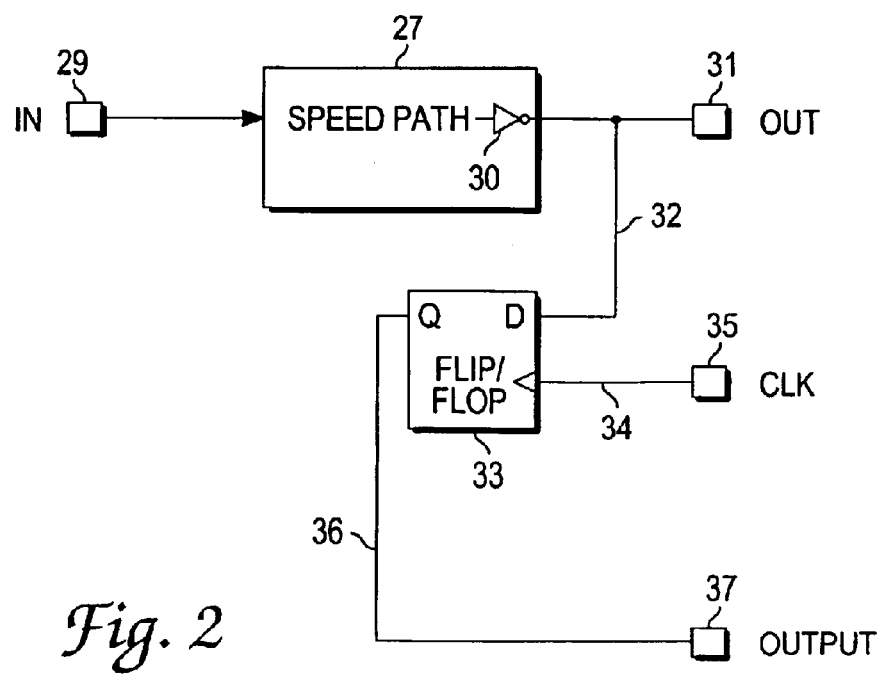
FIG. 2 is a schematic block circuit diagram slowing the improved speed test circuitry of the present invention.

With reference to FIG. 2, as in the prior speed test arrangements, the integrated circuit includes a speed path circuit block 27 for facilitating a speed test of signal delay between an input pin IN, 29, and an output pin OUT, 31. The output buffer 30 within the speed path 27 is strong enough to drive the possible load on pad 31.

A D-type flip-flop 33 is provided to capture the output data. The flip-flop 33 is located close to the OUT pad 31 so that the extra load from line 32 is negligible. Routing is from the OUT pad 31 along conductive line 32 (accomplished with metal) to the D input of the flip-flop 33. A clock pad CLK, 35, is selected to be next to the OUT pad 31 and close to the flip-flop 33 so that the metal routing 34 from the CLK pad 25 to the clock input of flip-flop 33 is also small and any delay is negligible. The output Q of the flip-flop 33 is routed by line 36 to an OUTPUT pad 37 anywhere in the chip. The length of line 36 does not affect the result of the testing, since what matters is whether or not the OUTPUT changes value, not the timing for this particular output pad.

Figure 3:
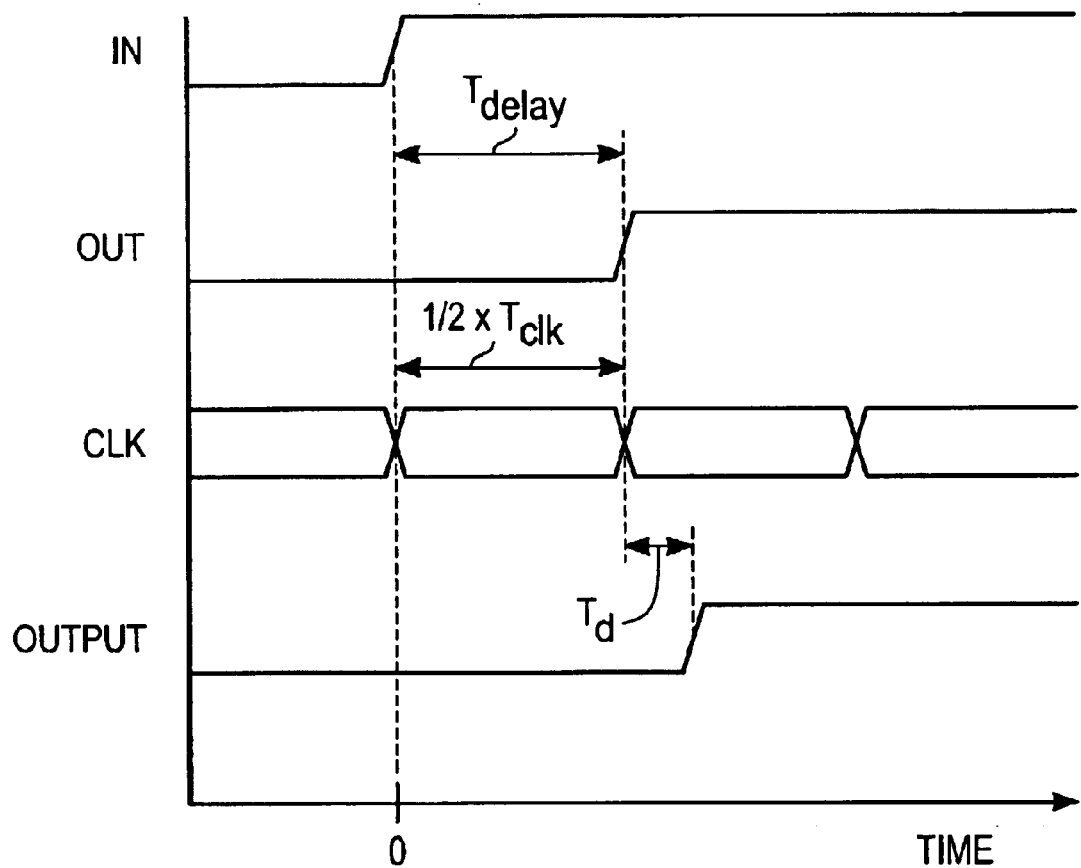
FIG. 3 is a timing diagram related to the circuit of FIG. 3.

With reference to FIG. 3, the operation of the test circuitry in FIG. 2 is illustrated with a timing diagram. When the input signal at IN pad 29 changes logic state at a time "0", the signal propagates through the speed path circuit block 27 and reaches OUT pad 31 after a time $T_{delay}$. This delay time is a measure of the input-to-output speed of the chip. The clock signal CLK also transitions at time "0", that is the transition at the IN pad 29 is made to coincide with a clock transition (either high-to-low or low-to-high). When the clock signal CLK transitions again after one-half of the clock period $T_{CLK}$, the D flip-flop 33 loads whatever the data value is at the OUT pad 31. By adjusting the clock frequency, the data value captured by the flip-flop 33 may be either an "0" (if the input transition has not yet reached the OUT pad) or a "1" (if the input transition has reached the OUT pad). The test frequency of the clock CLK can be gradually increased until a "1" is captured and sent to the OUTPUT pad 37. Then one-half of the clock period, $\frac{1}{2} \times T_{CLK}$, is equal to the delay time, $T_{delay}$. The OUTPUT pad 37 transitions slightly later than the capture time, i.e. at $T_{delay}+T_d$, the value depending upon the time it takes to travel from the Q output of the flip-flop 33 to the OUTPUT pad 37. However, the value of $T_d$ is unimportant to the measurement. What matters to the measurement is one-half the clock period for which OUTPUT pad registers a "1" value.

What is claimed is:

1. Test circuitry within an integrated circuit for facilitating accurate measurement of input-to-output signal speed of the integrated circuit by means of external test equipment probes, the test circuitry comprising:

input and output pads;

a signal path between said input and output pads, wherein a signal transition applied by test equipment to said input pad propagates to said output pad along such signal path with some delay time to be measured; and a D-type flip-flop having a data input connected to the output pad, a clock input connected to a test clock pad, and a data output connected to a second output pad, the D-type flip-flop being located in said integrated circuit near said output pad and test clock pad;

wherein probes of test equipment used to measure said input-to-output signal speed contact at least said input pad, said test clock pad and said second output pad, a signal transition applied at said input pad being registered by said D-type flip-flop and appearing at said second output pad when a variable frequency test clock signal applied to said test clock pad has a half-period coinciding with said delay time.

2. The test circuitry of claim 1 wherein said output pad and said test clock pad are adjacent to each other.

3. The test circuitry of claim 1 wherein the D-type flip-flop is located so as to minimize load contributed by output pad and test clock pad connections to said flip-flop.

4. A method of accurately measuring an input-to-output signal speed of a integrated circuit using external test equipment probes, comprising:

a) manufacturing the integrated circuit with a signal path between an input pad and an output pad, with a D-type flip-flop connected at its data input to said output pad, said flip-flop having a clock input connected to a test clock pad, said flip-flop also having a data output connected to a second output pad;

b) contacting test equipment probes to said input pad, said test clock pad and said second output pad;

c) providing a variable frequency test clock signal to said test clock pad via one of said probes;

d) applying a signal transition coincident with a test clock signal transition to said input pad via another of said probes, the signal transition propagating along said signal path to said output pad, said signal transition being registered by said flip-flop whenever said test clock signal has a half-period sufficiently long for the signal transition to reach said output pad;

e) determining from a flip-flop output data value at said second output pad whether said signal transition has been registered by said flip-flop;

f) repeating steps (c)–(e) with successively slower frequency test clock signals until signal transition is registered, the half-period of said test clock signal for which registering of said signal transition has been positively determined being the measure of said input-to-output signal speed.

* * * * *